(12) United States Patent
Shibata et al.

(10) Patent No.: US 6,770,914 B2
(45) Date of Patent: Aug. 3, 2004

(54) III NITRIDE SEMICONDUCTOR SUBSTRATE FOR ELO

(75) Inventors: Tomohiko Shibata, Kasugai (JP); Keiichiro Asai, Nagoya (JP); Shigeaki Sumiya, Hekinan (JP); Mitsuhiro Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/163,256

(22) Filed: Jun. 5, 2002

(65) Prior Publication Data

US 2002/0192959 A1 Dec. 19, 2002

(30) Foreign Application Priority Data

Jun. 13, 2001 (JP) ........................................ 2001-178044

(51) Int. Cl.⁷ .............................................. H01L 29/22
(52) U.S. Cl. .......................... 257/94; 257/103; 257/794
(58) Field of Search ................................ 257/794, 627, 257/628, 94, 96, 103; 438/479

(56) References Cited

U.S. PATENT DOCUMENTS

| | | | | |
|---|---|---|---|---|
| 5,901,165 A | * | 5/1999 | Uchida | 372/45 |
| 5,990,495 A | * | 11/1999 | Ohba | 257/94 |
| 6,495,894 B2 | * | 12/2002 | Shibata et al. | 257/428 |
| 6,521,514 B1 | * | 2/2003 | Gehrke et al. | 438/479 |
| 2002/0081463 A1 | | 6/2001 | Shibata et al. | |
| 2002/0020850 A1 | | 2/2002 | Shibata et al. | |
| 2002/0155649 A1 | | 10/2002 | Shibata et al. | |
| 2002/0155682 A1 | | 10/2002 | Shibata et al. | |

* cited by examiner

*Primary Examiner*—Sara Crane
(74) *Attorney, Agent, or Firm*—Burr & Brown

(57) ABSTRACT

A III nitride semiconductor substrate for ELO is provided for forming a III nitride film whose surface is controlled independent of the film's thickness. A III nitride underlayer including at least Al is directly formed on a base made of e.g. a sapphire single crystal, and not formed through a buffer layer formed at a low temperature. After that patterns made of e.g $SiO_2$ are formed on the underlayer.

15 Claims, 4 Drawing Sheets

III NITRIDE SEMICONDUCTOR SUBSTRATE FOR ELO

BACKGROUND OF THE INVENTION (1) Field of the Invention

The present invention relates to a III nitride semiconductor substrate for Epitaxial Lateral Overgrowth (simply referred to as 'ELO', hereinafter), particularly a III nitride semiconductor substrate for ELO preferably usable as a substrate constituting a semiconductor light-emitting element such as a light-emitting diode, or a semiconductor element such as a high frequency or high output electronic device.

(2) Related Art Statement

III nitride films are employed as semiconductor films constituting a semiconductor light-emitting element such as a light-emitting diode, and recently, have caught a lot of attention as semiconductor flints constituting semiconductor elements such as high frequency electronic devices used in e.g. cellular phones.

Such III nitride films are usually formed by MOCVD methods. Concretely, a substrate on which III nitride films are formed is set onto a susceptor installed in a given reactor, and then, heated to 1000° C. or over with a heater provided in or out of the susceptor, Thereafter, raw material gases are introduced with a carrier gas into the reactor and supplied onto the substrate On the substrate, the raw material gases arc dissolved through thermochemical reaction into constituent elements, which are reacted to deposit and form a desired III nitride film on the substrate. The film is required to be low in its dislocation density, so that a semiconductor element constructed by the film attains designed properties.

However, since the melting points of III nitride materials are relatively high, it has been difficult to grow bulk single crystals made of the above III nitride materials. Therefore, there had been no means except that the nitride films are formed by heteroepitaxial growth on a different kind of single crystal substrate such as a sapphire single crystal substrate Actually, since the lattice constant of a GaN-based III nitride film largely differs from that of a sapphire single crystal substrate, misfit dislocations are created depending on the difference in the lattice constant, at the boundary between the GaN-based III nitride film and the sapphire single crystal substrate. Thereafter, misfit dislocations propagate into the GaN-based III nitride film, increasing the amount of dislocations in the GaN-based III nitride film. Such dislocations due to lattice misfit can be reduced to a certain extent by inserting a buffer layer grown at low temperature between the GaN-based Ill nitride film and the sapphire single crystal substrate.

However, in case of fabricating semiconductor elements required for a high output such as a laser diode or a light-emitting diode with high brightness, a light-detecting device is required for a low dark current, and an electronic device required for a high output at high frequency. The above GaN-based III nitride film was unable to attain desired performances to meet designed properties owing to its high dislocation density.

From the above point of view, an ELO technology has been developed, and a substrate using ELO technology has been developed.

FIG. 1 shows a structure of a conventional III nitride semiconductor substrate for ELO. FIG. 2 shows that a GaN-based III nitride film is formed on the III nitride semiconductor substrate for ELO shown in FIG. 1, by using an ELO technology.

The III nitride semiconductor substrate 5 for ELO shown in FIG. 1 is constructed by sequentially forming the buffer layer 2 made of e.g. GaN grown at low temperature, the underlayer 3 made of e.g. GaN, and the patterned layer 4 made of e.g. $SiO_2$, on the base 1 made of e.g. sapphire single crystal.

As shown in FIG. 2, if the GaN-based III nitride film 6 is formed on the III nitride semiconductor substrate 5 for ELO, dislocations penetrating from the underlayer 3 to the GaN-based III nitride film 6 propagate in the upper direction after laterally propagating as surrounding the pattern 4 as shown by the arrow X1, and propagate in the upper direction only as shown by the arrow X2.

Consequently, the amount of dislocations in the region A of the GaN-based III nitride film 6 above the pattern 4 are reduced. Therefore, the above semiconductor element has good properties because of its constituents' high crystal quality, utilizing the region A as predetermined constituents of the semiconductor element.

FIG. 3 shows a structure of another example of a conventional III nitride semiconductor substrate for ELO, and FIG. 4 shows that a GaN-based III nitride film is formed by an ELO technology on the III nitride semiconductor substrate for ELO shown in FIG. 3.

The III nitride semiconductor substrate 15 for ELO shown in FIG. 3 is constructed by sequentially forming the buffer layer 12 made of e.g. GaN formed at low temperature, and the underlayer 13 made of e.g. GaN having a concave-convex surface, on the base 11 made of e.g. sapphire single crystal.

As shown in FIG. 4, if GaN-based III nitride film 16 is formed on the HII nitride semiconductor substrate 15 for ELO, misfit dislocations created between the underlayer 13 and the GaN-based III nitride film 16 propagate in the upper direction after laterally propagating from the convex part 13A to the concave part 13B in the under layer 13 as shown by the arrow Y1, and propagate in the upper direction only as shown by the arrow Y2.

Consequently, the amount of dislocations in the region B above the concave part 13B in the GaN-based III nitride film 16 are reduced. Therefore, the above semiconductor element has good properties because of its constituents' high crystal quality, utilizing the domain B as predetermined constituents of the semiconductor element.

In case of growing the GaN-based III nitride film by means of ELO technology, since there is a region in which dislocations extend above as shown in FIGS. 2 and 4, an inconvenience has been that there is a limitation as to the region usable as a semiconductor element. As a result, if a laser diode, for example, is constructed by the above GaN-based II nitride film, luminous efficiency has been degraded owing to a lot of useless regions not usable as a semiconductor element. causing its yield to lower in photolithography processes.

Furthermore, if a light-emitting diode, for example, is constructed by the above GaN-based III nitride film, there had been an inconvenience that a lot of difference of light-emitting strength exists in the element, causing its light-emitting efficiency to decrease.

Furthermore, in case of utilizing the above GaN-based III nitride film as a substrate for a semiconductor element, it is necessary to form the GaN-based III nitride film comparably thickly, for example, 100 μm and more. However, in case of forming the GaN-based III nitride films by utilizing the III nitride semiconductor substrat 15 for ELO shown in FIGS. 1 or 3, there has been an inconvenience That the surface roughness of the GaN-based III nitride films gets worse considerably, as its thickness becomes larger.

Moreover, in case that a semiconductor element is fabricated by forming a predetermined GaN-based III nitride film on the above III nitride films used as a substrate, the crystal quality of the above GaN-based III nitride film formed on a GaN-based III nitride film semiconductor substrate is deteriorated because of the surface roughness of the GaN-based III nitride film semiconductor substrate. Accordingly, it has been unable to provide desired properties for the above semiconductor element, without carrying out polish processing.

SUMMARY OF THE INVENTION

An object of the present invention is to provide a III nitride film semiconductor substrate for ELO, to form a III nitride film having controlled surface roughness not depending on its thickness, as well as enhancing its use efficiency by controlling penetrating dislocations.

In order to accomplish the above object, the present invention relates to a III nitride semiconductor substrate for ELO, characterized in being provided with a predetermined base and a III nitride underlayer including at least Al formed on the base material.

The inventors of the present invention have intensively studied to draw out the above characteristics of ELO technology to the maximum, by controlling an increase of surface roughness in case of forming the above III nitride films thickly, because ELO technology maker it possible to simply improve the crystal quality of the III nitride films by reducing the amount of dislocations in the films As a result, they have found out the following facts. Paying attention to a structure of the III nitride semiconductor substrate for ELO in case of using ELO technology.

As described above, a conventional III nitride semiconductor substrate for ELO is constructed so that a GaN-based buffer layer deposited at low temperature is formed on a sapphire single crystal substrate as a base. The buffer layer makes it possible to grow the above GaN-based underlayer epitaxially, by means of reducing the difference in lattice constant between the sapphire single crystal substrate and the GaN-based underlayer Therefore, the buffer layer is formed at low temperature such as 500–700° C., disregarding its crystal quality to some extent.

Accordingly, it is possible to restrain misfit dislocations to some extent, due to the difference in lattice constant. However, it was found out that the GaN-based underlayer's crystal quality was deteriorated due to a mosaic structure of the buffer layer formed at low temperature. It is presumed that the surface roughness of the GaN-based III nitride film formed on the GaN-based III nitride semiconductor substrate for ELO is caused by the inferior crystal quality of the underlayer constituting the GaN-based III nitride semiconductor substrate for ELO.

Consequently, the present inventors have intensively studied to prevent the underlayer's crystal quality from deteriorating. As a result, they found out the following facts.

A conventional semiconductor element is constructed by a GaN-based III nitride film as its semiconductor layer constituting the element. Accordingly, it has been naturally thought that an underlayer of a III nitride semiconductor substrate for ELO used in forming a GaN-based III nitride film by ELO technology is constructed by the above GaN-based III nitride.

The present inventors have studied that a semiconductor element is mainly constructed by III nitride films mainly including Al. In the steps of the study, a trial was made that an underlayer of a III nitride semiconductor substrate for ELO is made up of an AlN-based III nitride film. As a result, it was found out that without the above buffer layer formed at low temperature, the AlN-based III nitride film can be epitaxially grown with superior crystal quality on a sapphire single crystal substrate and that it is possible to restrain creation of misfit dislocations at the boundary between the Perborate and the AlN-based III nitride film.

It was found out to be possible to control the roughness of the AlN-based III nitride film formed by an ELO technology on the III nitride semiconductor substrate for ELO, even if the thickness of the AlN-based III nitride film is larger. Furthermore, it also turned out that a GaN-based III nitride film formed on the above underlayer with high crystal quality has the same effect as the AlN-based III nitride.

Moreover, a dislocation density distribution of a III nitride film was investigated. As a result, a dislocation reduction was observed in a region where dislocations penetrated in case of using conventional underlayers. The greater the difference between Al content of the III nitride film and that of the underlayer, the greater the dislocation reduction effect. This is presumably attributed to the principle that compressive stress created in the III nitride film due to the difference in lattice constant has the effect to remove dislocations and to bend dislocation propagation to the transverse direction.

According to the Ill nitride semiconductor substrate for ELO, since the amount of dislocations penetrating through the III nitride film are reduced, its use efficiency increases. Furthermore, in case of the III nitride film being formed thickly on the substrate, it is possible to control the surface roughness of the III nitride film. Consequently, a thick III nitride film preferably usable as a substrate for a semiconductor element can be formed by ELO technology.

DESCRIPTION OF THE INVENTION

Figure 1:
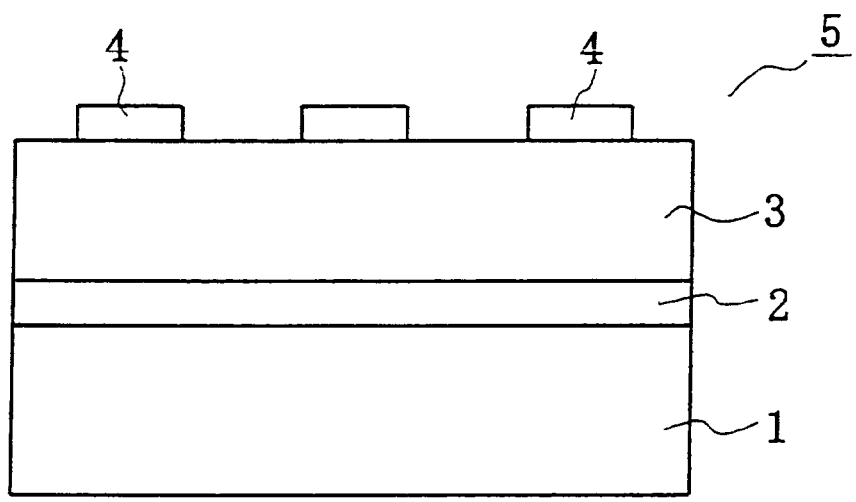
FIG. 1 is an explanatory view showing a structure of a conventional III nitride semiconductor substrate for ELO.
Figure 2:
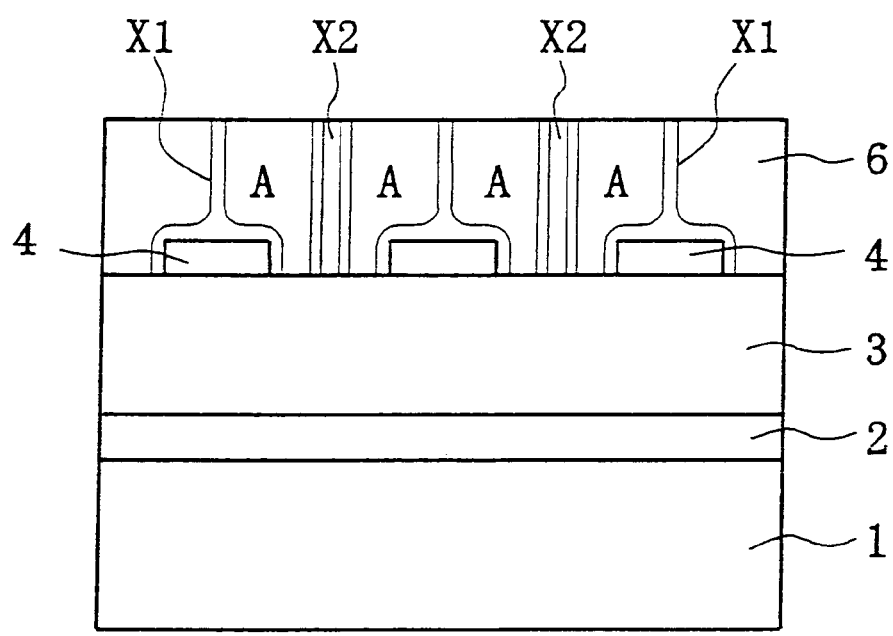
FIG. 2 is an explanatory view showing that a GaN-based III nitride film is formed by ELO technology on a III nitride semiconductor substrate for ELO as shown FIG. 1
Figure 3:
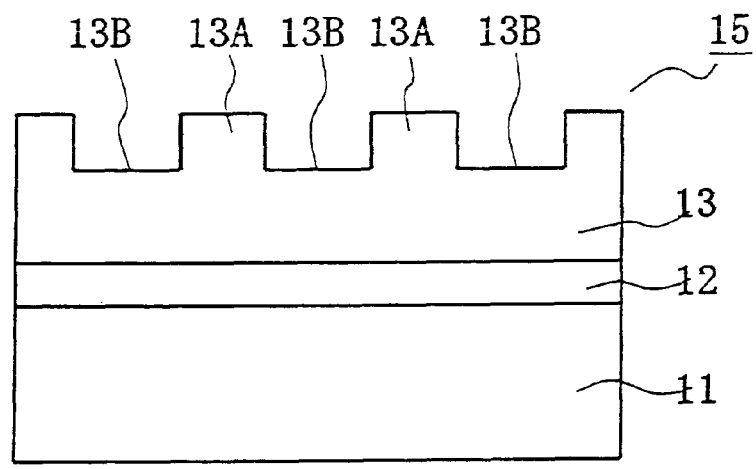
FIG. 3 is an explanatory view showing another structure of a conventional III nitride semiconductor substrate for ELO.

The present invention will be described in detail, hereinafter.

A III nitride semiconductor substrate for ELO of the present invention includes a III nitride underlayer including Al element as described above.

Furthermore, it is preferable to form a III nitride film mainly including Al on the III nitride semiconductor substrate for ELO by means of ELO technology, since the underlayer is made of the III nitride film including Al. In this case, the difference in lattice constant between the III nitride underlayer including Al and the III nitride film to be formed, is reduced. Accordingly, it is possible to grow the III nitride film epitaxially on the III nitride underlayer and to restrain misfit dislocations due to the difference in lattice constant.

As described above, it is preferable that the III nitride underlayer includes a lot of Al atoms. However, if it is necessary that the III nitride film formed on the III nitride semiconductor substrate for ELO includes a reduced amount of Al, the film can instead include increasing amounts of Ga and/or In depending on the kind of semiconductor element and its intended characteristics. Accordingly, in such a case, it is preferable that the Al content of the III nitride underlayer is reduced continuously or stepwise, in the direction of its thickness, that is to say, from the base to the surface opposite to the base of the above III nitride semiconductor substrate for ELO.

By such a condition, it is possible to make the Al content in the III nitride underlayer large neighboring the base and enhance its crystal quality, thus controlling creation of misfit dislocations described above. Moreover, it is possible to lower the Al content of the region neighboring the predetermined III nitride layer to be formed, that is, opposite to the base, As a result, it is possible to control creation of cracks in the III nitride underlayer, by inhibiting creation of tensile stress under growth of the III nitride film.

In addition, in case of varying the Al content of the III nitride underlayer continuously or stepwise, the region neighboring the base is preferably made of AlN, to control creation of misfit dislocations.

Furthermore, the III nitride underlayer including Al in the III nitride semiconductor substrate for ELO of the present invention makes it necessary to have a superior crystal quality due to its high orientation, by growing the underlayer epitaxially on the base to high orientation. Concretely, the full width of half maximum (FWHN) of X-ray rocking curve at (002) of the underlayer is preferably 200 seconds or below, more preferably 90 seconds or below The highly oriented, and highly crystallized III nitride underlayer is easily formed at 1100° C. and over, by a CVD method. In addition, it is preferable that the temperature for forming the III nitride underlayer is 1250° C. and below, to control the surface roughness of the III nitride underlayer as small as possible. Herein, 'the temperature for forming the film' is referred to as the temperature of the base itself in case of forming the III nitride underlayer.

The base of the III nitride semiconductor substrate for ELO of the present invention may be made of well-known substrate materials such as sapphire single crystal, ZnO single crystal, SiC single crystal, Si single crystal, GaAs single crystal, AlGaN single crystal, LiAlO$_2$ single crystal, LIGAO$_2$ single crystal, MgAl$_2$O$_4$ single crystal, and MgO single crystal.

However, since the III nitride underlayer of the III nitride semiconductor substrate for ELO is made of a III nitride film including Al, a sapphire single crystal is preferably employed as the base, due to effective control of misfit dislocations at the boundary between the base and the underlayer, and its low cost.

Furthermore, the thickness of the III nitride underlayer is preferably 1–3 μm, although it may be decided depending on a kind of the III nitride underlayer and its desired crystal quality.

More particularly, although the III nitride underlayer is required to include Al as a constituting element, it may include Ga, In as a III element except Al, and, if necessary, may include Si, Ge, Be, Mg, Zn, As, P, or B, or a transition metal.

Figure 5:
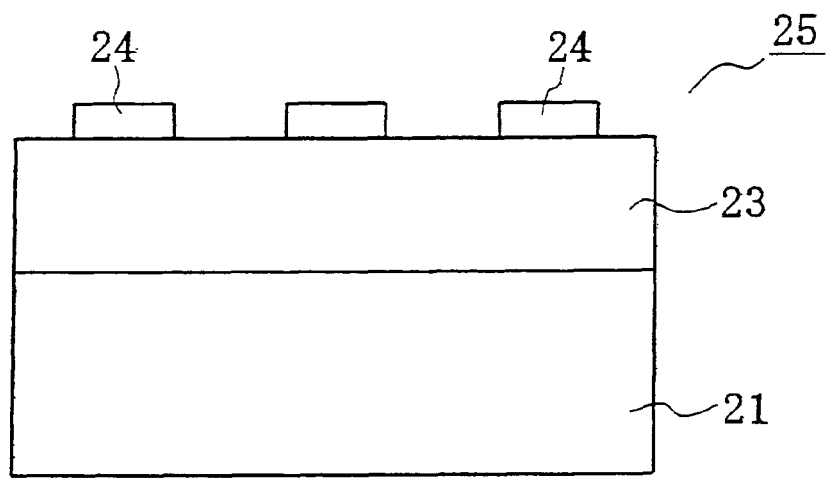
FIG. 5 is an explanatory view showing a structure of the present III nitride semiconductor substrate for ELO.
Figure 6:
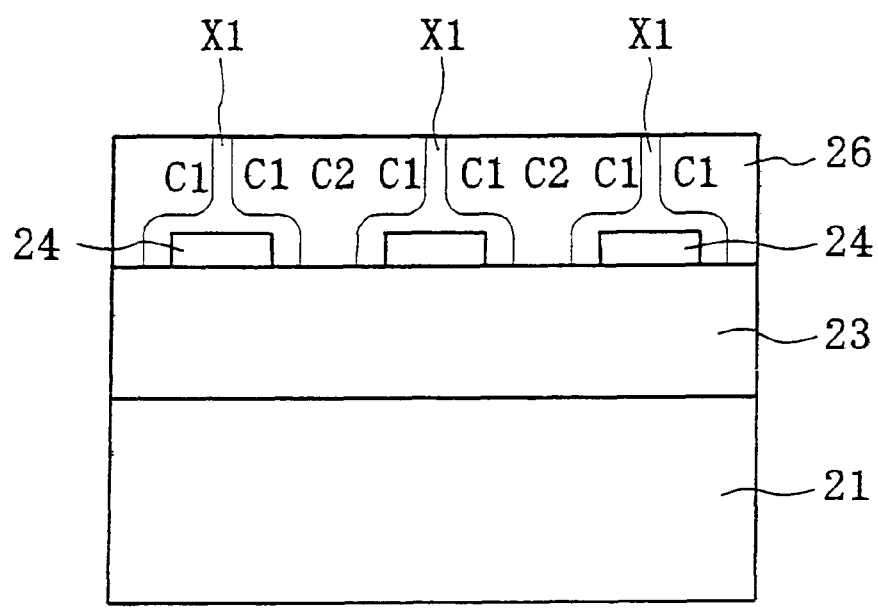
FIG. 6 is an explanatory view showing that a III nitride film is formed by ELO technology on the TIT nitride semiconductor substrate for ELO as shown FIG. 5.

FIG. 5 is an explanatory view showing one example of the present III nitride semiconductor substrate for ELO. FIG. 6 is an explanatory view showing that a III nitride film is formed by ELO technology on the III nitride semiconductor substrate for ELO as shown FIG. 5.

The III nitride semiconductor substrate 25 for ELO shown in FIG. 5 is composed of the base 21 made of e.g. a sapphire single crystal, the III nitride underlayer 23 including Al formed on the base, and the pattern 24 made of e.g SiO$_2$ formed on the underlayer 23. The underlayer may be formed according to the above-described preferable kind of conditions, as required.

When the predetermined III nitride film 26 is formed on the III nitride semiconductor substrate 25 for ELO as shown Fig. 6, the dislocations penetrating from the underlayer 23 to the III nitride film 26 almost propagate as shown by the arrow X1, while the number of dislocations propagating to the upper direction as shown by the arrow X2 are remarkably reduced. Consequently, the amount of dislocations in the III nitride film 26, which are both in the region C1 above the pattern 24 and in the region C2 above the space between the neighboring patterns 24, are reduced.

Furthermore, even if the above III nitride film is formed thickly according to high crystallization due to high orientation of the underlayer 23, the surface roughness of the III nitride film can be controlled. Accordingly, it is able to provide a III nitride film preferably usable as a component of a semiconductor element, for example, a substrate.

Figure 7:
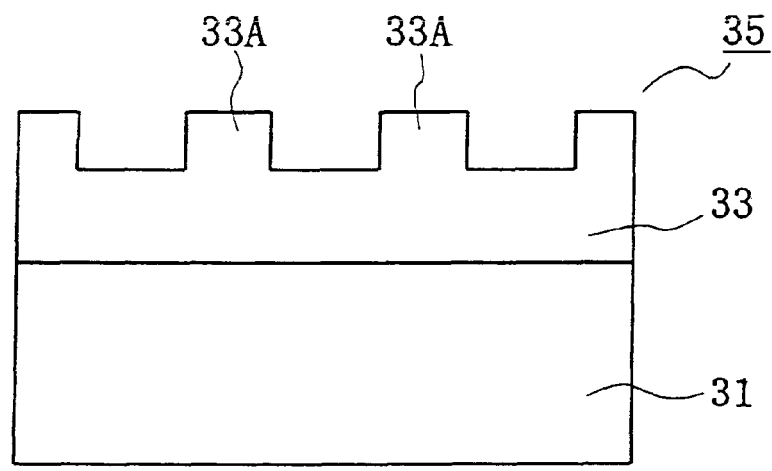
FIG. 7 is an explanatory view showing another structure of the present III nitride semiconductor substrate for ELO.
Figure 8:
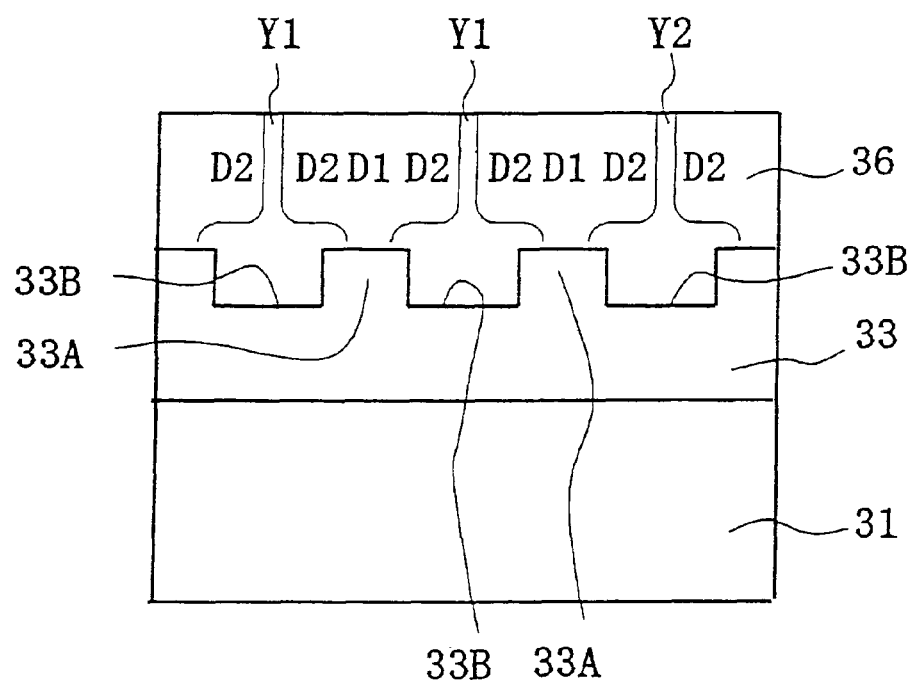
FIG. 8 is an explanatory view showing that a III nitride film is formed by ELO technology on a III nitride semiconductor substrate for ELO as shown FIG. 7.

FIG. 7 is an explanatory view showing another example of the present III nitride semiconductor substrate for ELO. FIG. 8 is an explanatory view showing that a III nitride film is formed by ELO technology on a III nitride semiconductor substrate for ELO as shown FIG. 7.

The III nitride semiconductor substrate 35 for ELO shown in FIG. 7 is composed of the base 31 made of e.g. sapphire single crystal, the III nitride underlayer 33 including Al formed on the substrate. The surface of the under layer 33 is forted as concave-convex by using a predetermined mask pattern. The underlayer 33 may be constructed according to the above-described preferable kind of conditions, as required.

Figure 4:
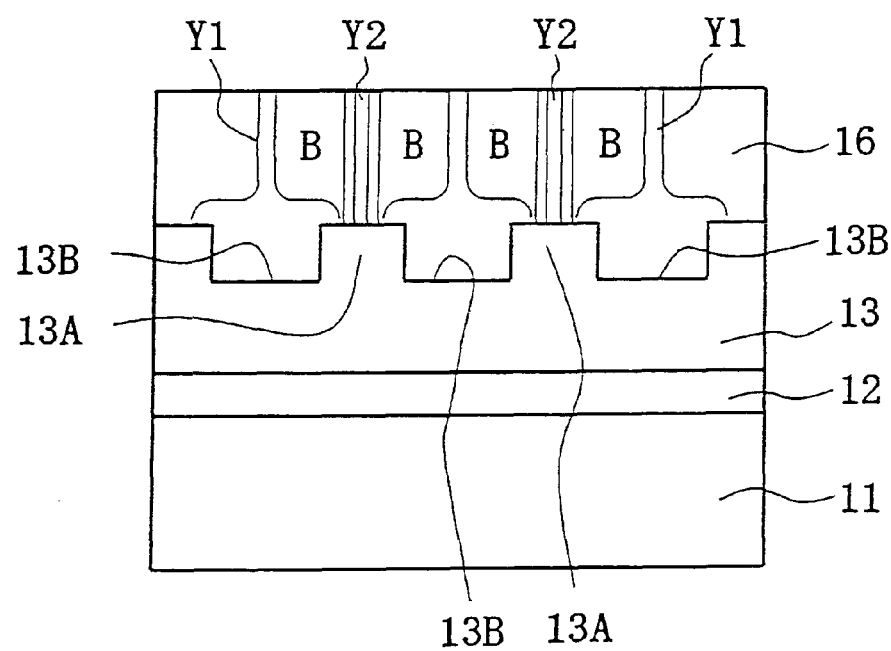
FIG. 4 is an explanatory view showing that a GaN-based III nitride film is formed by ELO technology on a III nitride semiconductor substrate for ELO as shown FIG. 3.

When the predetermined III nitride film 36 is formed on the III nitride semiconductor substrate 35 for ELO shown in FIG. 7, misfit dislocations created at the boundary between the underlayer 33 and the III nitride film 36 propagate as shown by the arrow Y1 in FIG. 8, while the number of dislocations propagating to the upper direction as shown by the arrow Y2 in FIG. 4 are remarkably reduced. Consequently, the amount of dislocations in the region D1 above the convex part 33A and in the region D2 above the concave part 33B, are reduced. In this case, there are no inconveniences, if any gaps exist above the concave part 33B in the III nitride film 36.

Furthermore, even if the above III nitride film is formed thickly according to high crystallization due to high orientation of the underlayer 33, the surface roughness of the III nitride film can be controlled. It is thus possible to provide a III nitride film preferably usable as a component of a semiconductor element, for example, a substrate.

The patterns 24 may be a plurality of stripes, or a plurality of arbitrary figures which are isolated from each other Moreover, concave-convex patterns in the underlayer 33 may be formed in arbitrary figures as required. Furthermore, concave-convex patterns may be formed in a predetermined III nitride film which is beforehand formed on the lower layer 33, instead of directly forming concave-convex patterns in the underlayer 33.

The present invention will be concretely described hereinafter with reference to examples.

EXAMPLE 1

An AlGaN film was formed by using the III nitride semiconductor substrate 35 for ELO shown in FIG. 5. A base made of c- faced sapphire single crystal was set onto a susceptor installed in a given reactor. Next, a $H_2$ carrier gas was provided at a flow rate of 3 m/sec, with the pressure set at 15 Torr.

And then, the base was heated to 1200° C. A trimethylaluminum (TMA) gas as an Al raw material gas and an ammonia ($NH_3$) gas as a nitrogen raw material gas were introduced with $H_2$ carrier gas and supplied onto the substrate, keeping a molecular ratio of $TMA/NH_3$ at 1/450. Through growing an AlN film epitaxially on the base for 120 minutes, an AlN film as a III nitride underlayer was formed in a thickness of 2 $\mu$m.

It was found out that the underlayer has superior crystal quality, with FWHM in X-ray rocking curve at (002) reflection being 50 sec Next, the III nitride semiconductor substrate for ELO was fabricated so that patterns made of $SiO_2$ with its width being 7 $\mu$m and its interval being 3 $\mu$m was formed on the AlN film, by a deposition process through a predetermined mask After that, on a deposition condition that a trimethylgallium (TMG) gas as a Ga raw material gas instead of a TMA gas was introduced with $H_2$ carrier gas and supplied onto III nitride semiconductor substrate for ELO, keeping a molecular ratio of TMG/NH3 at 1/1500, by changing the pressure to be 100 Torr and the substrate temperature to be 1050° C., a GaN film as a TIT nitride film was formed in a thickness of 10 $\mu$m through epitaxial growth for 120 minutes. The surface roughness (Ra) of the GaN film was 5 Å and the dislocation density was $10°/cm^2$ in a region above the pattern and $10^7/cm^2$ at a region above a part between patterns neighboring each other.

EXAMPLE 2

An AlGaN film was formed by using 111 nitride semiconductor substrate for ELO shown in FIG. 6.

As in the Example 1, after the AlN film was formed at a thickness of 2 $\mu$m on c-faced sapphire base, a III nitride semiconductor substrate for ELO was fabricated so that the surface of AlN film was patterned to concave-convex shape by etching through a mask. A width of a pattern was 3 $\mu$m and its interval was 7 $\mu$m.

Next, a GaN film as a III nitride film was formed at a thickness of 10 i m on the III nitride semiconductor substrate for ELO in the same way as that of the Example 1. The surface roughness (Ra) of the GaN film was 5 Å and the dislocation density was $10°/cm^2$ in a region above a concave part, and $10^7/cm^2$ in a region above a convex part.

Comparative Example 1

An AlGaN film was formed by using III nitride semiconductor substrate for ELO shown in FIG. 1.

A base made of c- faced sapphire single crystal was set onto a susceptor installed in a given reactor. Next, a $H_2$ carrier gas was introduced at a flow rate of 1.5 m/sec, with the pressure set at 100 Torr. After that, to clean the surface of the sapphire base, the sapphire base was heated to 100° C., kept at the temperature for 10 minutes, and then, cooled down to 600° C.

Next, a GaN film as a buffer layer was formed in a thickness of 0.03 $\mu$m, by providing a TMG gas and a $NH_3$ gas at a molecular ratio of TMG/ $NH_3$ of 1/1500.

After that, the supply of the TMG gas was temporarily stopped and the temperature of the base was set at 1050° C. Next, a TMG gas was again introduced on the same condition as that of the above buffer layer deposition forming a GaN film as a III nitride film at a thickness of 3 $\mu$m. After that, the III nitride semiconductor substrate for ELO was fabricated so that patterns made of $SiO_2$ with its width being 7 $\mu$m and its interval being 3 $\mu$m were formed on the GaN film, by a deposition process through a predetermined mask.

Next, a GaN film as a III nitride film was formed at a thickness of 10 $\mu$m on the III nitride semiconductor substrate for ELO in the same way as that of the Example 1. The surface roughness (Ra) of the GaN film was 20 Å and the dislocation density was $106/cmr$ in a region above the pattern, and $10^8/cm^2$ in a domain above a part between patterns neighboring each other.

Comparative Example 2

As in the Comparative Example 1, after a GaN film as a buffer layer was formed at a thickness of 0.03 $\mu$m and a GaN film was formed at a thickness of 3 $\mu$m on c-faced sapphire base, the III nitride semiconductor substrate for ELO was fabricated so that the surface of the GaN film was patterned to a concave-convex shape by etching through a mask. A width of a pattern was 3 $\mu$m and its interval was 7 $\mu$m.

Next, A GaN film as a III nitride film was formed at a thickness of 10 $\mu$m on the III nitride semiconductor substrate for ELO in the same way as that of the Example 1. The surface roughness (Ra) of the GaN film was 20 Å and the dislocation density was $10^6/cm^2$ in a region above a concave part, and $10^8/cm^2$ in a region above a convex part.

As apparent from the above examples and the comparative examples, a GaN film formed on a III nitride semiconductor substrate for FLO according to the present invention has a reduced dislocation density and a good distribution of dislocations, as compared to a GaN film formed on a conventional III nitride semiconductor substrate for ELO. In addition, the surface roughness of the GaN film is remarkably improved. Consequently, it is possible to improve a crystal quality of a whole semiconductor element and to attain desired properties as designed.

Although the present invention was described in detail with reference to the above examples, this invention is not limited to the above disclosure and every kind of variation and modification may be made without departing from the scope of the present invention As explained above, a Ill nitride semiconductor substrate for ELO of the present invention is fabricated by a high crystalline III nitride underlayer directly formed on a predetermined base, not through a conventional buffer layer formed at low temperature. Accordingly, in case of forming a III nitride film thickly on the III nitride semiconductor substrate for ELO, it is possible to reduce dislocation density in the III nitride film, to improve a distribution of dislocations in the III nitride film, and to reduce a surface roughness, owing to an ELO technology. As a result, it is possible to improve characteristics of a semiconductor element including such a III nitride film.

What is claimed is:

1. A III nitride semiconductor substrate for ELO comprising:
    a base; and
    a III nitride underlayer including at least Al element formed on said base, wherein the full width of half maximum of X-ray rocking curve at (002) of said III nitride underlayer is 200 seconds or below, and a surface of said III nitride underlayer is concave-convex.

2. A III nitride semiconductor substrate for ELO as defined in claim 1 wherein the Al content of said III nitride underlayer is at least 50 atomic %.

3. A III nitride semiconductor substrate for ELO as defined in claim 2, wherein said III nitride underlayer comprises AlN.

4. A III nitride semiconductor substrate for ELO as defined in claim 1 wherein the Al content of said III nitride underlayer is reduced continuously or stepwise, in a thickness direction extending away from said base.

5. A III nitride semiconductor substrate for ELO as defined in claim 4, wherein the part of said III nitride underlayer neighboring said base comprises AlN.

6. A III nitride semiconductor substrate for ELO as defined in claim 1, wherein said III nitride underlayer is formed at a temperature of at least 1100° C. by a CVD method.

7. A III nitride semiconductor substrate for ELO as defined in claim 6, wherein said III nitride underlayer is formed at 1100–1250° C by a CVD method.

8. A III nitride semiconductor substrate for ELO, comprising:
    a Ill nitride underlayer including at least Al formed on said base, wherein
    the fall width of half maximum of X-ray rocking curve at (002) of said III nitride underlayer is 200 seconds or below, and wherein-concave-convex patterns are provided on said III nitride underlayer.

9. A III nitride semiconductor substrate for ELO as defined in claim 8, wherein the Al content of said III nitride underlayer is at least 50 atomic %.

10. A III nitride semiconductor substrate for ELO as defined in claim 9, wherein said III nitride underlayer comprises AlN.

11. A III nitride semiconductor substrate for ELO as defined in claim 8, wherein the Al content of said III nitride underlayer is reduced continuously or stepwise, in a thickness direction extending away from said base.

12. A III nitride semiconductor substrate for ELO as defined in claim 11, wherein a part of said III nitride underlayer neighboring said base comprises AlN.

13. A III nitride semiconductor substrate for ELO as defined in claim 8, wherein said III nitride underlayer is formed at a temperature of at least 1100° C. by a CVD method.

14. A III nitride semiconductor substrate for ELO as defined in claim 13, wherein said III nitride underlayer is formed at 1100–1250° C by a CVD method.

15. A III nitride semiconductor substrate for ELO as defined in claim 8, wherein the surface of said III nitride underlayer is concave-convex.

* * * * *

UNITED STATES PATENT AND TRADEMARK OFFICE
CERTIFICATE OF CORRECTION

PATENT NO. : 6,770,914 B2
DATED : August 3, 2004
INVENTOR(S) : Tomohiko Shibata et al.

It is certified that error appears in the above-identified patent and that said Letters Patent is hereby corrected as shown below:

Column 5,
Line 1, add -- DETAILED -- before "DESCRIPTION OF THE INVENTION --.

Column 10,
Between lines 5 and 6, add -- a base; and --.
Line 8, change "fall" to -- full --.
Line 10, delete "wherein-".

Signed and Sealed this

Eleventh Day of October, 2005

JON W. DUDAS
*Director of the United States Patent and Trademark Office*